| United States Patent [19] | | [11] | 4,279,717 |
|---|---|---|---|
| Eckberg et al. | | [45] | Jul. 21, 1981 |

[54] ULTRAVIOLET CURABLE EPOXY SILICONE COATING COMPOSITIONS

[75] Inventors: Richard P. Eckberg, Round Lake; Ronald W. LaRochelle, Clifton Park, both of N.Y.

[73] Assignee: General Electric Company, Waterford, N.Y.

[21] Appl. No.: 63,648

[22] Filed: Aug. 3, 1979

[51] Int. Cl.$^3$ .................... C08F 2/46; C08G 77/08
[52] U.S. Cl. .................... 204/159.13; 204/159.11; 428/413; 428/447; 528/12; 528/13; 528/19; 528/23; 528/27; 528/31; 528/32; 528/33
[58] Field of Search .................... 204/159.13, 159.11

[56] References Cited

U.S. PATENT DOCUMENTS

| 3,726,710 | 4/1973 | Berger et al. | 204/159.13 |
|---|---|---|---|
| 4,101,513 | 7/1978 | Fox et al. | 526/193 |
| 4,103,747 | 8/1978 | Crivello | 204/159.18 |
| 4,127,460 | 11/1978 | Gaske et al. | 204/159.13 |
| 4,130,690 | 12/1978 | Lien et al. | 428/412 |
| 4,133,939 | 1/1979 | Bokerman et al. | 428/447 |
| 4,136,102 | 1/1979 | Crivello | 260/440 |

*Primary Examiner*—Harold D. Anderson
*Attorney, Agent, or Firm*—Michael J. Doyle; John L. Young; Philip L. Schlamp

[57] ABSTRACT

Epoxy functional diorganosiloxane fluids are combined with bis-aryl iodonium salts, particularly linear alkylate bis-dodecylphenyl iodonium salts to form a silicone coating composition effective for rendering surfaces non-adherent to other surfaces which would normally adhere thereto, and which will cure to a final non-adherent state upon brief exposure to ultraviolet radiation. Adhesion of the silicone coating to a substrate can be improved with the addition of β-(3,4-epoxycyclohexyl)ethyltrimethoxy silane.

8 Claims, No Drawings

ULTRAVIOLET CURABLE EPOXY SILICONE COATING COMPOSITIONS

BACKGROUND OF THE INVENTION

This invention relates to improved ultraviolet curable silicone coating compositions. More particularly, it relates to pre-crosslinked epoxy functional polydiorganosiloxane silicone fluids which are effectively cured by ultraviolet radiation in the presence of certain linear alkylate iodonium salts. These UV curable silicone coating compositions are particularly well suited for paper release applications.

Silicone compositions have long been used for rendering surfaces non-adherent to materials which would normally adhere thereto. For a long time, it was necessary that these silicone coatings be applied as a dispersion within a solvent in order to control the viscosity of the coating material so as to be suitable for coating applications. However, although the solvent aids in the application of the coating, it is a highly inefficient process inasmuch as the solvent must thereafter be evaporated. The evaporation of solvent requires large expenditures of energy. Additionally, pollution abatement procedures require that solvent vapors be prevented from escaping into the air. Removal and recovery of all the solvent entail considerable expenditure for apparatus and energy.

Thus, it has been noted that there is a need to provide a solventless coating composition which will, however, remain easy to apply to the substrate. Such solventless coating compositions are sometimes referred to as "100% solids" compositions. The absence of solvent in such compositions lowers the amount of energy required to effect a cure and eliminates the need for expensive pollution abatement equipment. The present invention provides a solventless pre-crosslinked epoxy functional polydiorganosiloxane fluid which will cure to a non-adherent surface when combined with an effective amount of a linear alkylate diaryl iodonium salt and exposed to ultraviolet radiation.

Release coatings are useful for many applications whenever it is necessary to provide a surface or material which is relatively non-adherent to other materials which would normally adhere thereto. Silicone paper release compositions are widely used as coatings which release pressure-sensitive adhesives for labels, decorative laminates, transfer tapes, etc. Silicone release coatings on paper, polyethylene, Mylar and other such substrates are also useful as non-stick surfaces for food handling and industrial packaging applications.

For example, when labels are coated with an adhesive, it is desirable that the paper backing be easily peeled away from the label when it is ready for use, yet the adhesive quality of the label should not be derogated by the fact that it has been peeled away from the substrate upon which it was stored. The same principle applies to certain types of adhesive tapes which come in rolls. It is necessary that the tape unroll easily and still maintain its adhesive characteristics. This can be accomplished by coating the non-adhesive side of the tape with a silicone release composition which will come into contact with the adhesive as the roll of tape is manufactured.

Silicone release compositions are often sold as dispersions of reactive polysiloxanes in organic solvents such as toluene, or as emulsions in water. A cross-linking catalyst, also known as the curing agent, is then added to the polysiloxane-solvent mixture. The coating composition is applied to a substrate which is passed through an oven to evaporate the carrier fluid and cure the silicone to an non-adherent or "adhesive" surface. As noted above, this process is quite energy intensive since it requires high oven temperatures to evaporate the solvent and effect the cure at commercially useful speeds.

Use of these solvent based products is becoming increasingly unattractive because of rising energy costs and stringent regulation of solvent emissions into the atmosphere. Other solventless silicone release compositions such as that described in copending U.S. application, Ser. No. 40,015, filed May 17, 1979, and which is assigned to the same assignee of the present invention, have addressed the environmental problem of hydrocarbon emission but still require high oven temperatures for proper cure.

Optimum energy savings as well as necessary ecological considerations are both served by radiation curable compositions. Specifically, an ultraviolet (UV) radiation curable 100% solids silicone release system eliminates the need for high oven temperatures and for expensive solvent recovery systems, and is, therefore, a useful and commercially desirable product.

UV curable silicone compositions are not unknown. A patent issued to R. V. Viventi, U.S. Pat. No. 3,816,282, June 11, 1974, and assigned to the General Electric Company, describes a room temperature vulcanizable silicone composition (RTV) in which mercaptoalkyl substituents attached to polysiloxanes add to vinyl functional siloxanes in a free-radical process upon UV irradiation in the presence of free-radical type photosensitizers. The particular compositions described by Viventi cure too slowly to be useful for paper release applications. Furthermore, the use of mercaptoalkyl photoreactive substituents gives rise to offensive odors both in product manufacture and in cured materials.

Ultraviolet radiation will initiate free-radical crosslinking in the presence of common photosensitizers which are well-known to persons familiar with the art of radiation curing mechanisms. However, silicone compositions which utilize photosensitizers (such as benzophenone) as a curing agent also require stabilizers (such as hydroquinone) to prevent premature reaction and provide reasonable shelf-life.

Commonly available photosensitizers are only slightly soluble in polydimethylsiloxane fluids which are the basic starting materials for silicone coating compositions. Low solubility causes problems in selection of these necessary ingredients. A further difficulty inherent in free-radical systems is oxygen inhibition which necessitates that the coated substrates be under an inert atmosphere while undergoing irradiation in order to cure within a reasonable amount of time. Use of an inert atmosphere adds complication and expense to the coating and curing process.

It has now been discovered that UV curable epoxy functional silicones which are suitable for release coating applications fall into a narrow range of epoxy content and viscosity. The limits to these parameters are imposed by the necessity of coating 0.1 to 0.3 mil layers of these silicone fluids onto various substrates, and by the necessity for these formulations to cure quickly upon exposure to UV radiation and while adhering well to the substrate.

The requirement that these epoxy functional silicones be applied in thin coats dictates that the fluids be of low viscosity such as, for example, approximately 500 to 25,000 centistokes. Consequently, the epoxy functional silicones must be low molecular weight fluids. Also, the efficiency of the curing catalyst must be high in order to provide sufficient cross-linking and the formation of a tight, smear-resistant coating which adheres well to the substrate.

The requirement for a highly efficient photo initiator severly restricts the structure of the catalyst since it also must be capable of dissolving or dispersing well in the epoxy functional silicone fluid. Copending U.S. application Ser. No. 974,497, filed Dec. 29, 1978, by J. V. Crivello, which is assigned to the same assignee as the present invention, discloses a UV initiated cationic ring-opening curing mechanism for dimethyl epoxy chain-stopped linear polydimethylsiloxane fluids utilizing bis-aryliodonium salts of the following formula,

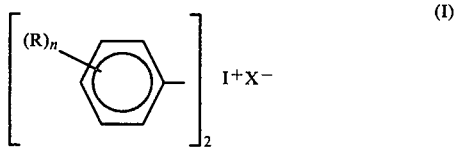

(I)

wherein $X=SbF_6$, $AsF_6$, $PF_6$, or $BF_4$ and wherein R is a $C_{(4-20)}$organo radical selected from alkyl and haloalkyl and mixtures thereof and n is a whole number equal to 1 to 5, inclusive. The catalysts described by the Crivello application are thick, high viscosity liquids or waxy solids which disperse poorly in low molecular weight epoxy functional silicones utilized by the present invention. These catalysts exhibit typical solubility characteristics of diaryliodonium salts, namely, being soluble in polar organic solvents such as chloroform and acetone but insoluble in non-polar organic solvents such as pentane, hexane and petroleum ether. Such solubility behavior severely limits the utility of these salts for initiating the rapid photocuring of epoxy functional silicone paper release compositions.

Although Crivello discloses that R may equal organo radicals selected from alkyl, haloalkyl and branched alkyl groups containing from 4 to 20 carbon atoms, he did not appreciate the unique characteristics of "linear alkylate" bis(dodecylphenyl) iodonium salts such as are disclosed by the present invention. These bis(dodecylphenyl) iodonium salts will rapidly dissolve in the polysiloxane base polymer fluid and disperse throughout, thereby being an efficient photo initiator agent. Such salts are particularly well adapted for use with the novel epoxy functional silicone coating compositions herein provided.

Epoxy functional silicone paper release coating compositions must ordinarily have epoxy contents of less than approximately 12 weight percent because of the end uses to which such coatings will be put, namely, to serve as non-adherent surfaces capable of releasing aggressive pressure sensitive adhesives. When the epoxy content of the silicone compositions is greater than about 12 weight percent, excessive force is required to remove adhesive coated articles from the cured silicone coatings. Note, however, that this may be a useful characteristic whenever it is desirable to selectively control the release characteristics of an adhesive.

It is therefore an object of the present invention to provide novel epoxy functional silicone fluids.

It is another object of the present invention to provide ultraviolet light curable epoxy functional silicone coating compositions.

Another object is to provide silicone coating compositions which exhibit improved adhesion to substrates upon which they are applied.

It is another object of the present invention to provide a process for preparing epoxy functional silicone coating compositions.

It is another object of the present invention to provide a method for rendering surfaces non-adherent to materials which would normally adhere thereto.

It is another object of the present invention to provide products with non-adherent surfaces of ultraviolet curable epoxy functional silicone coatings.

These and other objects of the present invention will become apparent to those skilled in the art upon consideration of the following detailed description of the invention.

SUMMARY OF THE INVENTION

The epoxy functional polydiorganosiloxane silicone fluids provided by the present invention are more specifically dialkylepoxy chainstopped polydialkyl-alkylepoxysiloxane copolymers wherein the polysiloxane units contain lower alkyl substituents, notably, methyl groups. The epoxy functionality is obtained when certain of the hydrogen atoms on the polysiloxane chain of a polydimethyl-methylhydrogensiloxane copolymer are reacted in a hydrosilation addition reaction with other organic molecules which contain both ethylenic unsaturation and epoxide functionality. Ethylenically unsaturated species will add to a polyhydroalkylsiloxane to form a copolymer in the presence of catalytic amounts of platinum-metal. Such a reaction is the cure mechanism for other silicone compositions, however, in the present invention, a controlled amount of this cross-linking is permitted to take place in a silicone precursor fluid or intermediate, and this is referred to as "pre-crosslinking". Pre-crosslinking of the precursor silicone fluid means that there has been partial cross-linking or cure of the composition and offers the advantages to the present invention of enabling swift ultraviolet light initiated cure with little expense for energy and with the elimination of the need for a solvent.

The ultraviolet curable epoxy functional silicone intermediate fluid comprises a pre-crosslinked epoxy functional dialkyl epoxy chainstopped polydialkyl-alkyl epoxy siloxane copolymer silicone fluid which is the reaction product of a vinyl- or allylic-functional epoxide and a vinyl functional siloxane cross-linking fluid having a viscosity of approximately 1 to 100,000 centipoise at 25° C. with a hydrogen functional siloxane precursor fluid having a viscosity of approximately 1 to 10,000 centipoise at 25° C. in the presence of an effective amount of precious metal catalyst for facilitating an addition cure hydrosilation reaction between the vinyl functional cross-linking fluid, vinyl functional epoxide, and hydrogen functional siloxane precursor fluid.

The vinyl- or allylic-functional epoxide may be a cycloaliphatic epoxy compound such as 4-vinylcyclohexeneoxide, vinylnorbornenemonoxide, and dicyclopentadienemonoxide.

The precious metal catalyst can be selected from the group of platinum-metal complexes which includes complexes of ruthenium, rhodium, palladium, osmium, iridium and platinum.

The vinyl functional siloxane cross-linking fluid can be selected from the group consisting of dimethylvinyl chain-stopped linear polydimethylsiloxane, dimethylvinyl chain-stopped polydimethyl-methylvinyl siloxane copolymer, tetravinyltetramethylcyclotetrasiloxane and tetramethyldivinyldisiloxane. The hydrogen functional siloxane precursor fluid can be selected from the group consisting of tetrahydrotetramethylcyclotetrasiloxane, dimethylhydrogen chain-stopped linear polydimethylsiloxane, dimethylhydrogen chain-stopped polydimethyl-methyl-hydrogen siloxane copolymer and tetramethyldihydrodisiloxane.

When the above-described pre-crosslinked epoxy functional silicone intermediate fluids are combined with an appropriate bis-aryl iodonium salt, an ultraviolet light cure reaction can be initiated in order to form a final product such as a solventless silicone release coating. The adhesion of these compositions to a substrate can be improved with the addition of a small amount of β-(3,4-epoxycyclohexyl)ethyltrimethoxy silane.

The UV curable epoxy functional silicone compositions of the present invention can then be applied to cellulosic and other substrates including paper, metal, foil, glass, PEK paper, SCK paper, and polyethylene, polypropylene and polyester films. A UV initiated reaction will cure the epoxy functional silicone compositions of the present invention and form a non-adherent, adhesion surface on the coated substrate.

When this pre-cross-linked epoxy functional silicone intermediate fluid is combined with an appropriate bisaryl iodonium salt, an ultraviolet cure reaction can be initiated in order to form a final product such as a solventless silicone release coating.

DESCRIPTION OF THE PREFERRED EMBODIMENTS

Ultraviolet light curable silicone coating compositions of the present invention are obtained by combining an iodonium salt which is effective for catalyzing an ultraviolet light initiated cure reaction of the silicone coating composition, with a pre-crosslinked dialkyl epoxy chain-stopped polydialkyl-alkyl epoxy siloxane silicone fluid having a viscosity of approximately 10 to 10,000 centipoise at 25° C.

The preferred UV-light initiator utilized by the present invention is a diaryl iodonium salt derived from "linear alkylate" dodecylbenzene. Such salts have the following general formula,

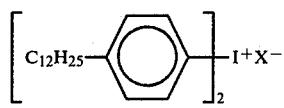

(II)

wherein X equals SbF$_6$, AsF$_6$, PF$_6$, or BF$_4$. These bis(4-dodecylphenyl)iodonium salts are very effective initiators for the UV cure of a wide range of epoxy functional silicones.

"Linear alkylate" dodecylbenzene is known commercially and is prepared by Friedel-Craft alkylation of benzene with a C$_{11}$–C$_{13}$ α-olefin cut. Consequently, the alkylate contains a preponderance of branched chain dodecylbenzene, but there may, in fact, be large amounts of other isomers of dodecylbenzene such as ethyldecylbenzene, plus isomers of undecylbenzene, tridecylbenzene and etc. Note, however, that such a mixture is responsible for the dispersive character of the linear alkylate derived catalyst and is an aid in keeping the material fluid. These catalysts are free-flowing viscous fluids at room temperature.

These new bis-dodecylphenyl iodonium salts (II) are profoundly different from previously characterized diaryliodonium salts (I). They are both pentane-soluble and water-insoluble. The improvements in solubility and catalytic efficiency of these branched chain substituted salts are further underscored by comparison with analogous salts prepared from straight chain n-tridecylbenzene and n-dodcylbenzene. Two examples of these salts include bis(4-n-tridecylphenyl)iodonium hexafluoroantimonate and bis(4-n-dodecylphenyl)iodonium hexafluoroantimonate which have long linear hydrocarbon chains. These salts (I), in contrast to the new salts (II), are waxy solids which are neither pentane nor water-soluble, and which disperse very poorly in the epoxy functional silicones utilized by the coating compositions of the present invention. These catalysts afford very sluggish UV cures when utilized for release coatings.

The UV curable silicone coating compositions of the present invention utilize novel epoxy functional silicone fluids which can be prepared in several ways. Epoxy compounds such as 4-vinylcyclohexeneoxide, depicted by the following formula,

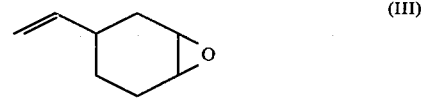

(III)

can be combined with Si—H functional polysiloxanes. An addition cure reaction also known as a hydrosilation can take place between the vinyl functional groups and the Si—H groups. It should be understood that the silicone coating composition undergoes an amount of "pre-crosslinking" before the UV catalyst is added to the composition. Pre-crosslinking refers to the ability of the Si—H functional groups to react with the vinyl groups of dimethylvinyl-stopped linear polydimethylsiloxane fluids, or of other vinyl-containing polysiloxanes, and it serves the useful purpose of providing a composition which can be cured to its final adhesive state with the expenditure of much less energy than would be needed for a composition that is not so pre-crosslinked.

In other words, ordinary silicone coating compositions require large expenditures of energy such as high oven temperatures, in order to cure the product to a final condition. However, the present invention utilizes an intermediate epoxy functional fluid which has already undergone an amount of pre-crosslinking or hydrosilation such that only small amounts of UV radiation will be necessary to cure it to its final state in the presence of the iodonium salt initiators also provided herein.

The epoxy functional silicones can be prepared from other vinyl- or allylic-functional epoxy compounds containing olefinic moieties such as allylglycidylether or glycidyl acrylate, vinylnorbornene monoxide and dicyclopentadiene monoxide. Although cyclohexyl epoxy compounds are particularly useful, other vinyl-functional cycloaliphatic epoxy compounds may also be used without significantly altering the properties of the product. The scope of the invention is not limited to the 4-vinylcyclohexeneoxide species used in the examples.

The epoxy functional polysiloxane intermediate fluids can be prepared in any of several ways. The following examples illustrate several of these methods but it must be understood that the present invention is not limited by these examples. Those skilled in the art will be able to provide other epoxy functional silicone intermediate fluids upon consideration of these examples.

EXAMPLE 1

470 grams of a dimethylvinyl chain-stopped linear polydimethylsiloxane fluid having an average molecular weight of 62,000 was mixed with 54 grams of 4-vinylcyclohexeneoxide and 0.2 grams Lamoreaux catalyst ($H_2PtCl_6$ in octyl alcohol) which is described in U.S. Pat. No. 3,220,972, issued Nov. 30, 1965, and assigned to the same assignee as the present invention. These materials were dissolved in 550 grams hexane, then 30 grams of tetramethylcyclotetrasiloxane (MeHSiO)$_4$ were slowly added to the above solution. The complete mixture was refluxed at 70° C. for three hours. The hexane solvent was stripped off at 60° C. under vacuum, providing a hazy fluid having a viscosity of 875 centipoise as the epoxy functional pre-crosslinked silicone product.

EXAMPLE 2

300 grams of a dimethyl hydrogen chain-stopped linear polydimethylsiloxane fluid of average molecular weight 6,000 was combined with 0.2 grams Lamoreaux platinum catalyst and was dissolved in 200 grams hexane. A mixture of 4.2 grams of tetravinyltetramethylcyclotetrasiloxane (MeViSiO)$_4$ and 7.6 grams of 4-vinylcyclohexeneoxide were added dropwise to the stirring solution. The complete reaction mixture was refluxed at 70° C. for two hours. Upon stripping off the solvent, the epoxy functional silicone intermediate was a clear amber fluid with a viscosity of 800 centipoise.

EXAMPLE 3

An epoxy functional silicone fluid with improved shelf-life and performance as compared to Examples 1 and 2, can be provided by combining 18.8 grams of 4-vinylcyclohexeneoxide with 0.05 grams platimum catalyst and 7.0 grams of a dimethylvinyl chain-stopped polydimethylmethylvinylsiloxane copolymer containing 6.4% methyl-vinyl substitution and a viscosity of 100 centipoise. These materials were dissolved in 300 grams hexane in a 2-liter flask to which was added 300 grams of a dimethyl hydrogen chain-stopped polydimethyl-methyl hydrogen siloxane copolymer containing a total of 2.85% Si—H units and a viscosity of 100 centipoise. This fluid was slowly added to the stirring hexane solution over a 90 minute period. When this addition was completed the reaction mixture was refluxed at 70° C. for eight hours. 3.0 grams of 1-octene were added to the reaction mixture at this time and refluxing was resumed for 18 hours. The hexane solvent was stripped off as described above and a clear product having a viscosity of 380 centipoise remained which contained a 5.8% epoxy content in the form of 4-vinyl cyclohexaneoxide. Infrared analysis of the product detected no free MeH remaining since the 1-octene acts as an effective scavenging agent.

EXAMPLE 4

Dissolved into a two-liter flask containing 300 grams hexane were 11.0 grams 4-vinylcyclohexeneoxide and 0.05 grams platinum catalyst along with 15 grams of the vinyl-functional fluid described in Example 3, above. To this mixture was added 300 grams of a dimethyl hydrogen chain-stopped polydimethyl-methylhydrogensiloxane copolymer with a viscosity of 125 centipoise and which contained 1.75% methylhydrogen units. This mixture was then slowly added to the stirring hexane solution over a 30 minute period and the reaction mixture was refluxed at 70° C. for 8 hours. At this point, 0.2% MeH was detected as being unreacted so 6 grams of 1-hexene was added as a scavenging agent and the reflux was resumed for an additional 16 hours whereupon no unreacted MeH could be detected. The solvent was removed and a clear fluid product of 312 centipoise viscosity containing 3.4 weight percent epoxy in the form of 4-vinylcyclohexeneoxide remained.

It is desirable to have as little an amount of unreacted Si—H functional groups as possible in the final product because these Si—H functional fluids will rapidly age to a gel upon exposure to atmospheric moisture in the presence of catalytic amounts of platinum. By adding a small amount of a low boiling normal alkene such as the octene and hexene, as described in Examples 3 and 4 above, during the hydrosilation these alkenes act as MeH scavengers and reduce the unreacted MeH to an undetectable range without otherwise affecting the product. Excess alkene is then easily removed during the solvent stripping process.

The above examples are a limited demonstration of the scope and versatility of the epoxy silicone synthesis developed in the course of the present invention. It has been found that the addition of small amounts of vinyl functional dimethylsilicone fluids to the vinyl epoxide during the hydrosilation of the hydrogen functional precursor fluids not only provides the pre-crosslinking essential for proper performance of the product but also is an effective way to control the viscosity of the above-described epoxy functional silicone intermediate fluids.

The epoxy functional silicone coating composition of the present invention is cured to its final adhesive state with an effective amount of ultraviolet radiation. In order to effect such a cure, a cationic UV catalyst is incorporated into the epoxy functional fluid. For the purposes of the present invention, it has been found that a bis-aryliodonium salt containing a linear alkylate dodecyl substituent is a very effective UV initiator. Particularly effective, for example, is bis(4-dodecylphenyl)iodonium hexafluoroantimonate having formula (II) which can be synthesized in the following fashion. A two liter three-necked round bottom flask was fitted with a mechanical stirrer, a thermometer, a nitrogen inlet and a pressure equalizing addition funnel. To this reaction vessel was added approximately 100 parts by weight linear alkylate dodecylbenzene. To this was added approximately 30 to 60 parts by weight of potassium iodate and approximately 60 to 100 parts by weight of acetic anhydride as well as approximately 150 to 200 parts by weight glacial acetic acid. The mixture within the reaction vessel is continuously stirred and cooled to a temperature of approximately −10° C. to +10° C. A dry ice acetone bath is effective for reducing the temperature. Approximately 80 to 120 parts by weight of an acid solution is added to the contents of the reaction vessel to form a reaction mixture. The acid solution can be a mixture of concentrated sulphuric acid and additional glacial acetic acid. The acid solution may comprise a mixture of approximately 12% to 60% by weight of concentrated sulphuric acid and approximately 40% to 80% by weight glacial acetic acid. This acid solution is added to the reaction mixture at a rate effective for maintaining the reaction mixture temperature at approximately −5° C. to +5° C. After completion of the addition, a thick orange slurry is obtained and this reaction mixture can be slowly stirred for approximately 2 to 4 hours at near 0° C. The reaction mixture is then allowed to slowly warm to approximately 20° C. to 30° C. and the stirring is continued for approximately 8 to 15 hours.

As the temperature of the reaction mixture approaches 20° C. moderate exothermic reactions may occur but these can be quickly controlled by reimersing the reaction vessel into the cooling bath. The reaction mixture is then diluted with approximately 500 to 1,000 parts by weight of water and to this stirred mixture was added approximately 5 to 10 parts by weight sodium bisulfate or another Group Ia or Group IIa metal bisulfate.

Approximately 30 to 60 parts by weight of sodium hexafluoroantimonate is added to the reaction mixture. To this mixture is added approximately 100 to 150 parts of pentane and the mixture is stirred in the dark for approximately 2 to 4 hours. The aqueous and non-aqueous layers are then separated. A separatory funnel may be used. After separation, the aqueous layer can be further extracted with additional pentane. The pentane extracts are then combined with the non-aqueous layer and this mixture is washed with fresh water and then concentrated in a vacuum to afford a reddish-brown oil. This oil is then stored in the dark. This oil is an approximately 50% pure reaction mixture of bis(4-dodecylphenyl)iodonium hexafluoroantimonate. Although synthesis by the above-described method provides a bis-aryl iodonium salt which is only about 50% pure, nevertheless, the salt is quite effective for initiating an ultraviolet cure reaction of the epoxy functional silicone coating composition of the present invention and further purification, while useful, is not required.

Of course, other effective UV initiator salts having formula (II) may be provided by minor substitutions in the synthesis procedure. For example, the sodium hexafluoroantimonate can be substituted with salts containing $AsF_6$, $PF_6$, or $BF_4$ in order to provide a UV initiator having formula (II).

EXAMPLE 5

Initial cure studies were conducted in the following fashion. Epoxy functional silicones were prepared as described above for Examples 1 and 2 and were treated with 2% by weight of a cationic UV catalyst salt having formula (II) by thoroughly mixing the two substances. The efficacy of the UV catalysts designated by formula (II) as compared to the UV catalysts designated by formula (I) can be seen in Table 1. For each trial listed in Table 1, the heading "Synthesis" denotes the manner in which the epoxy functional precursor fluid utilized was prepared. The heading "Weight % Epoxy" refers to the weight percent of epoxy functionality in the chosen epoxy functional silicone fluid. The complete mixtures of epoxy functional silicone fluids and UV catalyst salts were then coated onto glass slides in layers of approximately 2 mils. The coatings were exposed to a single GE H3T7 medium pressure mercury arc lamp mounted a distance of 5 inches from the sample. The samples were all radiated in ambient atmosphere since inert blanketing is not required for this cure system. The expression "Cure" in the following table is defined as the formation of a tack-free solid coating.

TABLE 1

| Trial | Synthesis | Viscosity | Wt. % Epoxy | UV Catalyst and Cure Time (I) | (II) |
| --- | --- | --- | --- | --- | --- |
| A | Example 1 | 875 cps | 9.75 | slight gelation after 10 sec. | cure, 10 sec. |
| B | Example 2 | 100 cps | 3.8 | no cure, 10 sec. | cure, 10 sec. |
| C | Example 2 | 800 cps | 2.4 | cure, 10 sec. | cure, 10 sec. |
| D | Example 2 | 143 cps | 2.9 | no cure, 10 sec. | cure, 10 sec. |

EXAMPLE 6

The efficiency of bis(dodecylphenyl)iodonium hexafluoroantimonate as a UV catalyst for thin coatings of epoxy functional silicones applied to typical release substrates may also be evaluated. Coating mixtures of several epoxy functional silicones having 2% by weight of the bis(dodecylphenyl)iodonium hexafluoroantimonate were prepared as described in Example 5 above and were applied as coatings of approximately 0.5 mils to super calendared Kraft paper (SCK), polyethylene Kraft (PEK), and Mylar substrates by means of a doctor blade. The coated samples were then irradiated by one H377 UV lamp at a distance of 5 inches from the coated surface until a tack-free coating was obtained. The resulting films were then evaluated for their potential as release agents by qualitatively determining the films' rub-off, smear, migration, and release characteristics by techniques well-known to those familiar with release coating applications.

Rub-off occurs when a silicone coating fails to adhere to the substrate and can be rubbed off in little balls of cured silicone by gentle finger pressure. Smear is detected in an incompletely cured coating when a finger firmly pressed across the silicone film leaves an obvious permanent streak. Migration is detected by the Scotch (trademark) cellophane tape test. The coating is considered well cured and migration-free if a piece of No. 610 Scotch tape will stick to itself after having been first firmly pressed into the silicone coating, then removed and doubled back on itself. If a silicone coating is shown to be migration-free by means of the Scotch tape test, it is considered to be a release coating because it adheres to the substrate with an adhesive force much greater than the adhesive force between the cured composition and the released aggressive Scotch tape. These qualitative tests are universally employed to ascertain the completeness of cure in silicone paper release coatings.

All of the sample epoxy functional silicone fluids listed in Table II cured to smear and migration-free non-adherent surfaces on the three substrates (SCK, PEK and Mylar) tested within approximately 10 to 15 seconds exposure from the single UV lamp when catalyzed with the 2% by weight crude iodonium salt of formula (II). Furthermore, it has been found that rub-off of cured coatings on SCK can be minimized if the substrate is mildly warmed. However, since mercury lamps used in UV cure operations generate considerable heat, rub-off from cellulosic substrates will not be a problem under these conditions. In the following table, "Synthesis" again refers to the method by which the epoxy functional silicone fluid was prepared.

TABLE II

| Trial | Synthesis | Viscosity | Wt. % Epoxy | Cure Speed in Sec. | | |
|---|---|---|---|---|---|---|
| | | | | SCK | PEK | Mylar |
| A | Example 1 | 782 cps | 10.8 | 10-15 | 10-15 | 10-15 |
| B | Example 3 | 950 cps | 15.3 | 10-15 | 5 | 10-15 |
| C | Example 3 | 95 cps | 12.2 | No cure (smear) | 15 | 15 |

The low viscosity of the silicone blend used in Trial C allowed it to soak into the surface of the SCK paper to the extent that a good cure was prevented. All of the samples tested displayed excellent cure on PEK without the need of adhesion promoters. This characteristic behavior of this system is quite significant because standard heat-cured solventless silicone release agents cannot be cured on most polyethylene or polypropylene films at oven temperatures sufficiently low to prevent destructive degradation of these substrates. Brief exposure to ultraviolet radiation, however, cures the epoxy silicone release compositions herein described without affecting the substrates.

Further UV cure evaluations may be accomplished by using a P.P.G. Model 1202 AN Ultraviolet Processor. This P.P.G. device utilizes two Hanovia medium pressure mercury vapor ultraviolet sources delivering 200 watts per square inch focused power to the irradiated surfaces. Samples to be exposed to UV radiation are affixed to a rigid carrier board and then passed under the lamps on a conveyor belt which operates at variable speeds from approximately 5 to 500 feet per minute. Since the focused lamp radiation is confined to an area about 6 inches wide on the moving conveyor belt, exposure times will vary from approximately 0.06 to 6 seconds for any individual pass under the lamps.

EXAMPLE 7

The following example further illustrates the cure behavior of the epoxy functional silicone fluids of the present invention. Coating baths of the candidate fluids were catalyzed with 1% by weight of bis(4-dodecylphenyl)iodonium hexafluoroantimonate. These fluids were hand-coated with a doctor blade onto 4 by 10 inch sections of PEK, SCK or Mylar which had previously been affixed to a carrier board. The coated substrates were then loaded onto the moving conveyor and exposed to the UV lamps of the P.P.G. processor for varying exposure times, depending on the line speed employed. Following exposure, the coated fluids were qualitatively examined for degree of cure by determining the presence or absence of smear, migration, and rub-off as described above. Because the P.P.G. UV processor delivers considerably more radiant energy to trial samples than the single H3T7 UV bulb utilized in earlier examples, the cure times observed for these experimental release compositions are much lower than those reported above. Table III depicts the cure time in seconds for epoxy functional silicone fluids containing various amounts of epoxy functionality as a weight percent of 4-vinylcyclohexene oxide. In the Table, the heading "Weight % Vinyl" refers to the small amount of vinyl functional dimethylsilicone fluids which may be added to the vinyl epoxide during the hydrosilation reaction of the hydrogen functional precursor fluids. It has been found that the addition of a small amount of vinyl functional silicone fluid is an excellent way to obtain low viscosity products. It can be seen from the table that the viscosity of the epoxy functional fluids prepared as described above is directly dependent upon both the epoxy content and the degree of pre-crosslinking permitted via the vinyl fluid. Viscosities of from approximately 300 to 1,000 centipoise are most preferred for solventless silicone applications. Exceptionally fast cures are noted on polyethylene substrates when the epoxy content is as low as 3%. Cure speed on SCK and Mylar was about equal. Thus, it is readily apparent that the cure rate is directly proportional to the epoxy content and a dramatic increase in cure rates can be seen in trial E where the epoxy content was above 20%. As noted above, there is also a correlation between cure speed and the degree of pre-crosslinking introduced into the epoxy functional silicone intermediate by use of vinyl functional fluids in the synthesis process. Higher amounts of these vinyl functional fluids significantly enhance cure rates. Introduction of these pre-crosslinking materials serve to minimize the dilution of cure performance which would otherwise result from lowering the amount of epoxy present in these compositions.

TABLE III

| Sample | Wt. % Epoxy | Wt. % Vinyl | Viscosity | Cure Time in Seconds | | |
|---|---|---|---|---|---|---|
| | | | | SCK | PEK | Mylar |
| A | 7.8 | 2.1 | 670 cps | 1.0 | 0.2 | 1.0 |
| B | 6.1 | 0 | 280 cps | 1.5 | 0.4 | 1.5 |
| C | 5.8 | 2.1 | 350 cps | 1.0 | 0.2 | 1.0 |
| D | 5.75 | 2.4 | 675 cps | 1.5 | 0.4 | 2.0 |
| E | 26.0 | 0 | 1200 cps | <0.1 | <0.1 | <0.1 |
| F | 3.4 | 4.6 | 312 cps | 1.5 | 0.6 | 3.0 |
| G | 2.9 | 5.8 | 800 cps | 3.0 | 1.0 | 5.0 |

EXAMPLE 8

In order to better assess the utility of these epoxy functional silicone compositions as paper release agents, quantitative measurements of the release characteristics of cured coatings of these materials when in contact with common aggressive adhesives can also be determined. Candidate compositions were prepared according to the synthesis described in Examples 3 and 4 above. Thin coatings of these compositions were catalyzed with 1% by weight of bis(4-dodecylphenyl)iodonium hexafluoroantimonate and were coated onto SCK with a doctor blade and then exposed to ultraviolet light for 1.5 seconds within the P.P.G. processor. Two 1×6 inch strips of Curity Wet-Pruf Adhesive Tape (No. 3142) were then applied to the cured epoxy silicone coatings and pressed into place by two passes with a 4.85 pound rubber roller. An identical 1×6 inch piece of tape was firmly affixed to the top of one of the tapes already in contact with the silicone layer. This layer was a blank or control. The laminate so prepared was then aged at 140° F. for 20 hours in an oven. Following removal from the oven, test laminates were allowed to cool to room conditions of 74° F. and 50% relative humidity.

The control tape was carefully removed from the back of the test tape and was affixed to a clean stainless steel "Q" panel. The force required to remove the test strips from the silicone surface was next ascertained by pulling the tape from the cured epoxy-silicone surface at 12 inches per minute on an Instron test device, and the required force was recorded in grams. Following removal of the test strips from the silicone release surfaces, one of the two test strips was affixed to the stainless steel "Q" panel adjacent to the control tape. The force required to remove both the control and the delaminated test tapes from the stainless steel surface was recorded. The percent of subsequent adhesion (%SA) can be calculated by comparing the recorded results for test and control strips, where percent SA equals the test divided by the control. A 90% SA or better demonstrates that no significant migration of silicone onto the adhesive took place. This is a quantitative version of the Scotch tape migration test described earlier. Test results for various samples correlating percent SA and percent epoxy content may be found in Table IV where again percent epoxy refers to the epoxy functionality in the form of 4-vinylcyclohexene oxide.

TABLE IV

| Sample | % Epoxy | Release, in grams for 6 trials | % SA |
| --- | --- | --- | --- |
| A | 2.9 | 20–45 | 90 |
| B | 3.4 | 20–40 | 90 |
| C | 5.8 | 25–40 | 100 |
| D | 7.8 | 35–60 | 100 |
| E | 11.0 | 70–100 | 100 |
| F | 26.0 | 350–400 | 100 |
| G | 37.0 | 350–500 | 100 |

By comparison, standard solvent dispersed silicone release agents will typically provide release of 40 to 70 grams under these conditions, so it is apparent that the epoxy functional dimethylsilicone fluids of the present invention can be cured with ultraviolet light to form non-adherent surfaces with acceptable release performance when the epoxy content is limited to about 8% or less. Of course, applications in which higher controlled release is desired would find high epoxy compositions useful. The present invention makes a wide range of release characteristics available by simple manipulation of the epoxy content in the epoxy functional silicones herein-described.

The adhesion to a substrate for UV cured paper release compositions can be improved with the addition of small amount of β-(3,4-epoxycyclohexyl)ethyltrimethoxy silane, having the following formula,

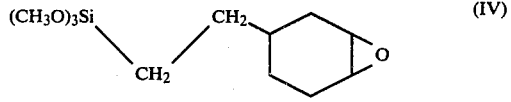  (IV)

during the hydrosilation addition of the vinyl functional epoxides to the Si—H precursor fluids as described in Example 7 above. Addition of this epoxy compound will particularly improve adhesion of the cured epoxy-silicone films to cellulosic substrates.

Thus, a new epoxy functional UV curable silicone paper release fluid can be synthesized in the following fashion.

EXAMPLE 9

60 grams of dimethylvinyl-chain-stopped linear polydimethylsiloxane fluid having a viscosity of 220 centipoise is combined with 30 grams of 4-vinylcyclohexene oxide and 5 grams of β-(3,4-epoxycyclohexyl)ethyltrimethoxy silane along with 0.05 grams of platinum catalyst. These materials are dissolved in 400 grams hexane in a two-liter flask. Added to the flask is 300 grams of a dimethylhydrogen chainstopped polydimethylmethylhydrogensiloxane copolymer containing a total of 4.3 weight percent of Si—H units. This material is slowly added to the stirring hexane solution over a 40-minute period. Following this addition, the complete reaction mixture is refluxed at 73° C. for 2 hours and 10 grams of normal hexene is added as a scavenger. Full reflux is resumed for 16 additional hours. Stripping off of the hexane solvent and the excess hexene at 80° C. under vacuum left a clear viscous fluid with a viscosity of 600 centipoise which contained 7.6 weight percent epoxide (in the form of 4-vinylcyclohexene oxide) and infrared analysis could not detect any unreacted Si—H.

Another sample was prepared precisely as described above, however, no β-(3,4-epoxycyclohexyl)ethyltrimethoxy silane was included in this synthesis. These two products were catalyzed with 1.5% by weight bis(4-dodecylphenyl)iodonium hexafluoroantimonate and were then coated onto 40 pound SCK paper with a doctor blade and cured with ultraviolet light in the P.P.G. UV processor. The composition including the silane (IV) could be cured to a smear and migration-free adhesive coating displaying little tendency to rub off the paper substrate in about 0.15 seconds of UV exposure. By contrast, the identical fluid lacking the silane coupling agent (IV) required a minimum of 1.0 seconds UV exposure to overcome unsatisfactory rub-off of the otherwise cured coatings from SCK substrates. Thus, the use of additive (UV) permits 5 to 10 times the line speed otherwise required for reasonable cure.

EXAMPLE 10

Additional quantitative measurements of the release characteristics of UV cured coatings of these epoxy functional silicone compositions have been obtained. The composition is prepared in a fashion alalogous to Example 9 above and had a viscosity of 500 centipoise and an epoxy content of 7.3%. Again, 1.5% by weight of the iodonium salt catalyst was added to the composition. Thin coatings were applied to 40 pound SCK paper by means of a doctor blade and were cured to a smear and migration-free adhesive surface with 0.15 seconds exposure to ultraviolet light as described in Example 7. After the cured silicone coatings were aged at room temperature for 2 hours, a 10 mil thick layer of Monsanto GMS-236 (Gelva 263) wet acrylic adhesive was applied on top of the silicone layer and then cured for 15 minutes at room temperature and additionally for 15 minutes at 150° F. A second sheet of SCK stock was then firmly pressed onto the adhesive layer. Lamina so prepared were cut into 2×9 inch strips and aged at 75° F. or at 140° F. Release testing of these laminates was accomplished immediately after their preparation and at regular time intervals upon aging by pulling the SCK/adhesive lamina from the SCK/silicone lamina at an angle of 180° at 400 inches per minute. The force required to separate the two lamina was recorded in grams. The results of this test are disclosed in Table V.

TABLE V

| Laminate Age | Release in grams for Samples Aged at 75° F. | Samples Aged at 140° F. |
| --- | --- | --- |
| Initial | 30 | 30–35 |
| 1 Day | 30 | 40–60 |
| 1 Week | 40 | 50–60 |
| 2 Weeks | 30–40 | 45–55 |
| 4 Weeks | 40–55 | 50–65 |

EXAMPLE 11

The versatility of the UV curable epoxy functional silicone release compositions of the present invention can be demonstrated by utilizing a wide range of common adhesives. A batch of epoxy-silicone fluid was prepared by combining 610 grams of a dimethylvinyl chain-stopped polydimethylsiloxane fluid having a viscosity of 150 centipoise with 305 grams of 4-vinylcyclohexene oxide and 50 grams of β-(3,4-epoxycyclohexyl)ethyltrimethoxysilane. These materials were mixed with 0.2 grams of platinum catalyst as described above and were dissolved in 4 kilograms of hexane. Slowly added to the stirring solution at 25° C. were 3 kilograms of dimethylhydrogen chainstopped polydimethylmethylhydrogensiloxane copolymer having a viscosity of 130 centipoise and containing 4.1% methylhydrogensiloxy units. Following the addition, the reaction mixture was refluxed at 73° C. for 4 hours and then cooled to below 70° C. whereupon 100 grams of normal hexene were added and refluxing was continued for 15 hours to complete the reaction. Following the reflux, the hexane solvent and the unreacted hexene were stripped off under 30 milimeters Hg vacuum at 100° C. affording a clear amber colored fluid product having a viscosity of 550 centipoise and containing approximately 7.5% epoxy functionality (in the form of 4-vinylcyclohexeneoxide) and infrared analysis detected no unreacted methylhydrogen functionality remaining. As noted above, small amounts (1 to 2% by weight) of β-(3,4-epoxycyclohexyl)ethyltrimethoxy silane added to these compositions aid in their cure and their adhesion to paper substrates. Note, however, that the use of this substance is not essential to the performance of the paper release product although it is a useful additive.

100 parts of the above-described epoxy functional silicone fluid were mixed with two parts of bis(4-dodecylphenyl)iodonium hexafluoroantimonate until a uniform dispersion of the catalyst within the silicone was obtained. The catalyzed composition was then coated onto an 18-inch wide roll of low density polyethylene coated Kraft paper by means of a three-roll offset gravure pilot quarter. Those skilled in the art will recognize that such offset gravure equipment is particularly well suited for depositing even thin films of solventless silicones on paper substrates for release applications. A single 18-inch long Hanovia medium pressure mercury vapor ultraviolet lamp provided 300 watts per square inch of focused radiation and was mounted above the moving substrate within three feet of the coating head so that the UV light was focused across the entire width of the silicone coated paper. Smear and migration-free cured coatings were obtained on the PEK substrate at line speeds up to 100 feet per minute. These line speeds provided UV exposures of approximately 0.05 seconds.

It should be noted that low density polyethylene coated Kraft substrates are very sensitive to heat and conventional thermally-cured silicone release coatings cannot be cured on these materials. However, the UV cured compositions described herein are particularly well suited for this application. In order to evaluate the cured coatings release performance, a wide range of silicone depositions were obtained at a line speed of 75 fpm. The cured coatings on the PEK substrate were stored at 0° to 30° C. for a week, and lamina were prepared utilizing three common adhesives. The release characteristics of these epoxy-silicone coatings were measured in grams as described previously. The results are summarized in Table VI.

TABLE VI

| Sample | Silicone Deposition, Pounds/Ream | Release, Grams | | |
|---|---|---|---|---|
| | | M-12* | A-40** | Gelva*** |
| 1 | 0.36 | 80–100 | 110–140 | 55–70 |
| 2 | 0.24 | 110–120 | 160–200 | 60–80 |
| 3 | 0.47 | 70–95 | 110–135 | 50–60 |
| 4 | 0.57 | 65–85 | 90–120 | 40–55 |

*M-12 Removable SBR Adhesive (Dennison Mfg. Co.)
**A-40 Permanent SBR Adhesive (Dennison Mfg. Co.)
***Gelva 263 Acrylic Adhesive (Monsanto)

Higher release values were noted for the lightest silicone depositions. These values did not significantly change after two weeks accelerated aging at 120° F. As noted above, release measurements falling below 100 grams versus the aggressive Gelva adhesive are regarded as premium release products.

What is claimed as new and desired to be protected by Letters Patent of the United States is:

1. An ultraviolet-curable silicone coating composition comprising: (a) a one-crosslinked epoxy functional dialkyl epoxy chainstopped polydialkyl-alkyl epoxy siloxane copolymer silicone intermediate fluid having a viscosity of approximately 10 to 10,000 centipoise at 25° C.; and (b) an amount of bis-(aryl) iodonium salt having the following formula,

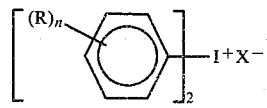

wherein X is selected from the group consisting of $SbF_6$, $AsF_6$, $PF_6$, and $BF_4$, and wherein R is a $C_{(4-20)}$ organo radical selected from the group consisting of alkyl and haloalkyl radicals and mixtures thereof and n is a whole number equal to 1 to 5 inclusive, which is effective for catalyzing an ultraviolet light initiated cure reaction of said polydiorganosiloxane silicone intermediate fluid.

2. An ultraviolet-curable silicone coating composition as in claim 1, wherein the bis-(aryl)iodonium salt is a linear alkylate bis(dodecylphenyl)iodonium salt having the following formula,

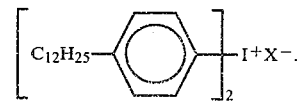

3. An ultraviolet-curable silicone coating composition as in claim 1, wherein the pre-crosslinked epoxy functional dialkyl epoxy chainstopped polydialkyl-alkyl epoxy siloxane copolymer silicone fluid is a dimethyl-β-(3,4-epoxycyclohexyl)ethyl silyl chainstopped polydimethyl-methyl-β-(3,4-epoxycyclohexyl)ethyl polysiloxane copolymer having approximately 1% to 100% epoxy functional siloxane units.

4. A composition as in claim 3, comprising approximately 1% to 20% epoxy functional siloxane units.

5. A process for providing an ultraviolet curable silicone coating composition comprising mixing a pre-crosslinked epoxy functional polydiorganosiloxane silicone intermediate fluid having a viscosity of approximately 10 to 10,000 centipoise at 25° C. with an amount of bis-(4-dodecylphenyl)iodonium salt having the formula,

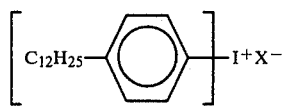

wherein X is selected from the group consisting of SbF$_6$, AsF$_6$, PF$_6$ and BF$_4$, which is effective for catalyzing an ultraviolet light initiated cure reaction of said polydiorganosiloxane silicone fluid.

6. A process as in claim 5, wherein the pre-crosslinked epoxy functional polydiorganosiloxane silicone intermediate fluid is a dimethyl-β-(3,4-epoxycyclohexyl)ethyl silyl chainstopped polydimethyl-methyl-β-(3,4-epoxycyclohexyl)ethyl polysiloxane copolymer having approximately 1% to 100% epoxy functional siloxane units.

7. A process as in claim 5, wherein the pre-crosslinked functional silicone fluid contains approximately 1% to 20% epoxy functional siloxane units.

8. A process as in claim 5, further comprising the step of adding an effective amount of β-(3,4-epoxycyclohexyl)ethyltrimethoxy silane.

* * * * *

UNITED STATES PATENT AND TRADEMARK OFFICE
CERTIFICATE OF CORRECTION

PATENT NO. : 4,279,717

DATED : July 21, 1981

INVENTOR(S) : Richard P. Eckberg, et al

It is certified that error appears in the above-identified patent and that said Letters Patent is hereby corrected as shown below:

Column 16, line 24, "one crosslinked" should read
-- pre-crosslinked --.

Signed and Sealed this

Twenty-fourth Day of August 1982

|SEAL|

Attest:

GERALD J. MOSSINGHOFF

Attesting Officer   Commissioner of Patents and Trademarks